US007187195B2

(12) United States Patent
Kim

(10) Patent No.: US 7,187,195 B2
(45) Date of Patent: Mar. 6, 2007

(54) PARALLEL COMPRESSION TEST CIRCUIT OF MEMORY DEVICE

(75) Inventor: Taek Seung Kim, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 194 days.

(21) Appl. No.: 11/008,298

(22) Filed: Dec. 10, 2004

(65) Prior Publication Data
US 2006/0123291 A1   Jun. 8, 2006

(30) Foreign Application Priority Data
Nov. 15, 2004   (KR) ...................... 10-2004-0093222

(51) Int. Cl.
*H03K 19/00*   (2006.01)
(52) U.S. Cl. .......................... 326/16; 365/201; 714/718
(58) Field of Classification Search .................. 326/38, 326/16, 82; 365/201; 714/718
See application file for complete search history.

(56) References Cited

U.S. PATENT DOCUMENTS

| 5,185,744 A | 2/1993 | Arimoto et al. |
| 5,475,692 A | 12/1995 | Hatano et al. |
| 5,717,701 A | 2/1998 | Angelotti et al. |
| 6,026,505 A * | 2/2000 | Hedberg et al. ............. 714/711 |
| 6,466,490 B2 | 10/2002 | Nagai et al. |
| 6,484,289 B1 | 11/2002 | Hsu |
| 6,590,799 B1 * | 7/2003 | Rickes et al. ............... 365/145 |
| 6,693,841 B2 | 2/2004 | Roohparvar et al. |
| 6,798,701 B2 | 9/2004 | Yamazaki |
| 2003/0071649 A1 | 4/2003 | Dankowski et al. |
| 2004/0004873 A1 * | 1/2004 | Rickes et al. ............... 365/201 |

FOREIGN PATENT DOCUMENTS

| JP | 11-339499 | 12/1999 |
| JP | 2000-067599 | 3/2000 |

* cited by examiner

*Primary Examiner*—Don Le
(74) *Attorney, Agent, or Firm*—Heller Ehrman LLP

(57) ABSTRACT

A parallel compression test circuit of a memory device disperses peak current and reduce noise by operating input/output amplifiers at different timings in a parallel compression test mode. The parallel compression test circuit comprises an input/output amplification control unit for activating a plurality of input/output amplifiers connected to a selected bank in a normal mode, and activating the plurality of input/output amplifiers in each bank at different timings in a test mode.

18 Claims, 7 Drawing Sheets

PARALLEL COMPRESSION TEST CIRCUIT OF MEMORY DEVICE

BACKGROUND ART

1. Field of the Invention

The present invention generally relates to a parallel compression test circuit of a memory device, and more specifically, to a technology of sequentially operating input/output amplifiers in a parallel compression test to disperse peak current and reduce noise.

2. Description of the Prior Art

FIG. 1 is a block diagram illustrating a conventional parallel compression test circuit of a memory device.

The conventional parallel compression test circuit of FIG. 1 comprises a memory unit 10, a compression comparing unit 20, a global input/output driving unit 30, an output driving unit 40, an input/output amplification control unit 50 and a global input/output driving control unit 60.

The memory unit 10 includes four banks 12, bit line sense amplifiers 14 and input/output sense amplifiers 16. Each of the input/output sense amplifiers 16 is activated by an input/output amplification control signal IOAEN outputted from the input/output amplification control unit 50.

The compression comparing unit 20 compares each data in input/output lines IOQ0~IOQ3 which is outputted from each bank 12 in a compression test. Although the example for compressing and comparing data in 16 input/output lines is described herein, the number of input/output lines for compressing and comparing data can be adjusted if necessary.

The global input/output driving unit 30 includes a plurality of global input/output drivers. The global input/output drivers 34 corresponding to the number of banks drive data in one of the input/output lines IOQ0~IOQ3 in response to a normal input/output driving control signal GIOENN outputted from the global input/output driving control unit 60 in a normal mode, and output the driven data to global input/output lines GIO0~GIO15. In a compression test mode, the global input/output driving units 30 drive signals IOCMP0~IOCMP3 outputted from the compression comparing unit 20 in response to a test global input/output driving control signal GIOENT outputted from the global input/output driving control unit 60, and output the driven data to the global input/output lines GIO0~GIO3. The rest global input/output drivers 32 drive data in one of the input/output lines IOQ0~IOQ3 in response to the normal global input/output driving control signal GIOENN only in the normal mode, and outputs the driven data to the global input/output lines GIO0~GIO15.

The output driving unit 40 drives data in the global input/output lines GIO0~GIO15 to output the driven data externally in the normal mode, and drives data in the global input/output lines GIO0~GIO3 to output the driven data in the compression test mode.

FIG. 2 is a circuit diagram illustrating the input/output amplification control unit 50 of FIG. 1.

The input/output sense amplifier control unit 50 comprises a delay unit 52, inverters IV1~IV3, and a NAND gate ND1.

The inverter IV1 inverts a signal YPR which represents a read operation period, and the delay unit 52 delays an output signal from the inverter IV1 for a predetermined time T1.

The inverter IV2 inverts an output signal from the delay unit 52, the NAND gate ND1 performs a NAND operation on output signals from the inverters IV1 and IV2, and the inverter IV3 inverts an output signal from the NAND gate ND1 to output an input/output amplification control signal IOAEN.

FIG. 3 is a circuit diagram illustrating the global input/output driving control unit 60 of FIG. 1.

The input/output driving control unit 60 comprises a delay unit 62, inverters IV4~IV7, and NAND gates ND2 and ND3.

The inverters IV4 and IV5 sequentially invert the test mode signal TPA, and the delay unit 62 delays the input/output amplification control signal IOAEN for a predetermined time T2.

The NAND gate ND2 performs a NAND operation on the input/output amplification control signal IOAEN and an output signal from the inverter IV4, and the inverter IV6 inverts an output signal from the NAND gate ND2 to output the normal global input/output driving control signal GIOENN.

The NAND gate ND3 performs a NAND operation on output signals from the delay unit 62 and the inverter IV5, and the inverter IV7 inverts an output signal from the NAND gate ND3 to output a test global input/output driving control signal GIOENT.

FIG. 4 is a timing diagram illustrating the operation of the parallel compression test circuit of FIG. 1.

The input/output amplification control unit 50 outputs the input/output amplification control signal IOAEN having a pulse width corresponding to the delay time T1 of the delay unit 32 in response to the signal YPR which represents the read operation period.

The input/output amplifier 16 re-amplifies data amplified by the bit line sense amplifier 12 during a high active pulse period of the input/output amplification control signal IOAEN to output the output signals IOQ0~IOQ3. Here, the output signals IOQ0~IOQ3 from the input/output amplifier 16 are signals obtained by amplifying data in 16 input/output lines.

The output signals IOQ0~IOQ3 from the input/output amplifier 16 are inputted the compression comparing unit 20 and the global input/output driving unit 30.

Each compression comparator 22 of the compression comparing unit 20 compresses and compares the output signals IOQ0~IOQ3 of the input/output amplifier 16 to output comparison signals IOCMP0~IOCMP3, respectively.

The global input/output driving unit 30 includes global input/output drivers 32 corresponding to the number of input/output lines in each bank 12. Each bank 12 comprises at least one or more of the parallel global input/output drivers 34 for selectively driving results of the normal or test modes.

In the normal mode, when the normal global input/output driving control signal GIOENN outputted from the global input/output driving control unit 60 is activated to a high level, all global input/output drivers 32 and 34 of the global input/output driving unit 30 are activated to drive and output the output signals IOQ0~IOQ3 from the input/output amplifier 16 to the global input/output lines GIO0~GIO15. All output drivers 42 of the output driving unit 40 drive and output data in the global input/output lines GIO0~GIO15.

In the compression test mode, when the test global input/output driving control signal GIOENT outputted from the global input/output driving control unit 60 is activated, the parallel global input/output driver 34 of the global input/output driving unit 30 is activated to drive the comparison signals IOCMP0~IOCMP3 outputted from the compression comparator 22 and output the driven signals to the global input/output lines GIO0~GIO3. The output drivers 42 in the output driving unit 40 drive and output data in the global input/output lines GIO0~GIO3.

In the normal operation, a selected bank is only operated, so that the input/output amplifier 16 and the global input/output driver 32 in the selected bank are However, in the compression test operation, the input/output amplifier 16 receives the input/output amplification control signal IOAEN outputted from the input/output amplification control unit 50, so that data of 64 bits are simultaneously outputted by 16 bits in each bank.

The compression comparing unit 20 simultaneously outputs the comparison signals IOCMP0~IOCMP3 interchangeably in the banks, and the global input/output driving unit 30 receives the global input/output driving control signals GIOENN and GIOENT outputted from the global input/output driving control unit 60, so that data are simultaneously outputted interchangeably in the banks.

As a result, since all of the input/output amplifiers 16 are simultaneously operated, the peak current becomes larger and noise is generated.

SUMMARY OF THE INVENTION

Accordingly, it is an object of the present invention to disperse peak current and reduce noise by operating input/output amplifiers in each bank at different timings.

It is another object of the present invention to improve reliability of a parallel test mode by operating the same test mode as a normal operation mode.

In an embodiment, a compression test circuit of a memory device comprises a plurality of banks, a plurality of input/output amplifiers, a plurality of compression comparators, a plurality of global input/output drivers, a plurality of output drivers and an input/output amplification control unit. Each of the plurality of banks which comprises a plurality of bit line sense amplifiers senses and amplifies data in bit lines. The plurality of input/output amplifiers amplify data which is amplified by the bit line sense amplifier in input/output lines. The plurality of compression comparators compress and compare data amplified by the plurality of input/output amplifiers in each bank. The plurality of global input/output drivers drive each data amplified by the plurality of input/output amplifiers or drive each of a plurality of comparison signals outputted from the plurality of compression comparators. The plurality of output drivers drive data driven by the global input/output driving unit to an external pin. The input/output amplification control unit generates a plurality of first control signals to activate the plurality of input/output amplifiers in each bank at different timings in a test mode.

In another embodiment, a compression test circuit of a memory device comprises a plurality of banks, a plurality of input/output amplifiers, a plurality of compression comparators, a plurality of global input/output drivers, a plurality of output drivers and an input/output amplification control unit. Each of the plurality of banks which comprises a plurality of bit line sense amplifiers senses and amplifies data in bit lines. The plurality of input/output amplifiers which is amplified by the bit line sense amplifier amplify data in input/output lines. The plurality of compression comparators compress and compare data amplified by the plurality of input/output amplifiers in each bank. The plurality of global input/output drivers drive each data amplified by the plurality of input/output amplifiers or drive each of a plurality of comparison signals outputted from the plurality of compression comparators. The plurality of output drivers drive data driven by the global input/output driving unit to an external pin. The input/output amplification control unit generates a plurality of first control signals to activate the plurality of input/output amplifiers connected to each bank in a test mode by a plurality of groups at different timings.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
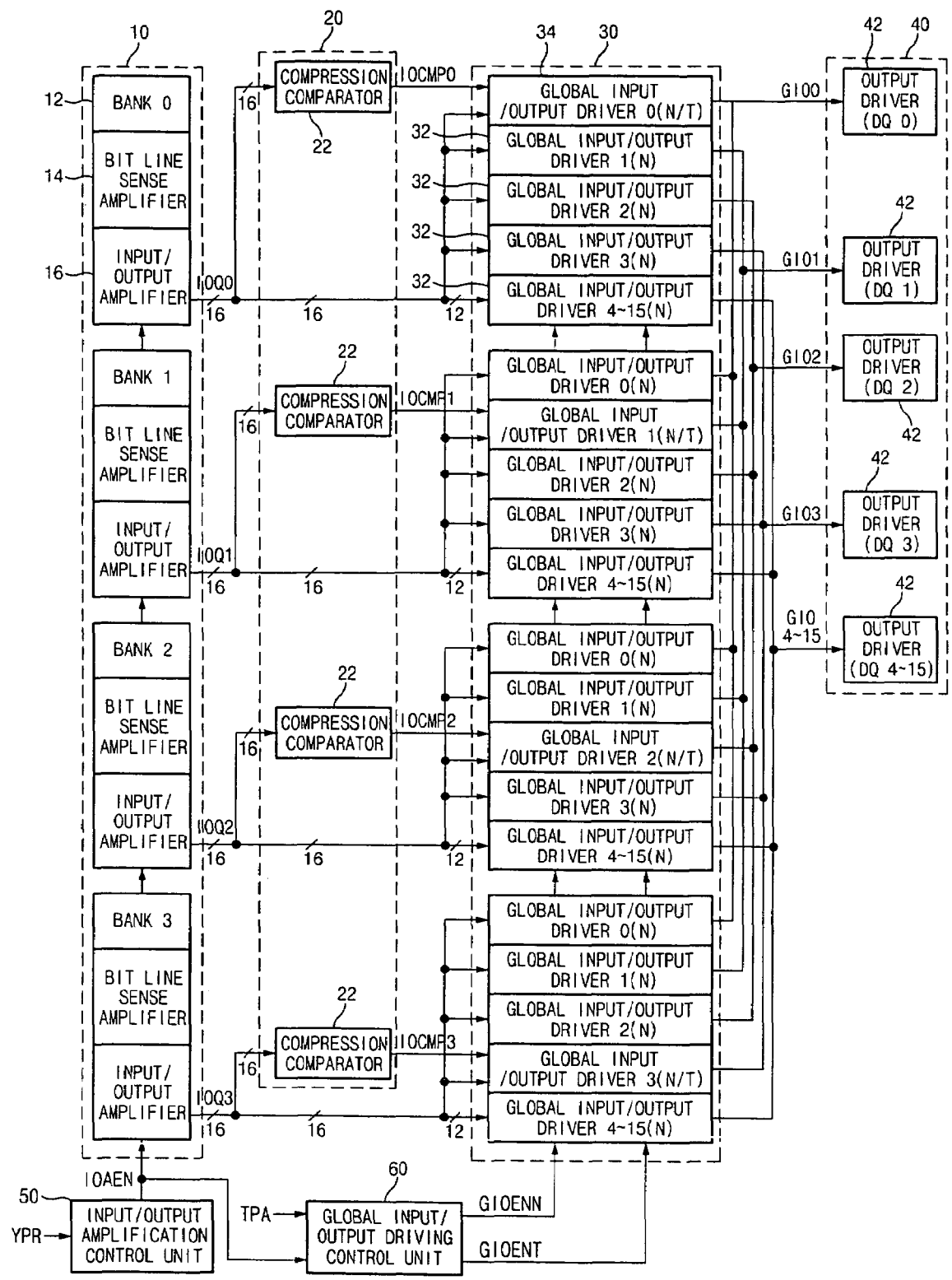
FIG. 1 is a block diagram illustrating a conventional parallel compression test circuit of a memory device.
Figure 2:
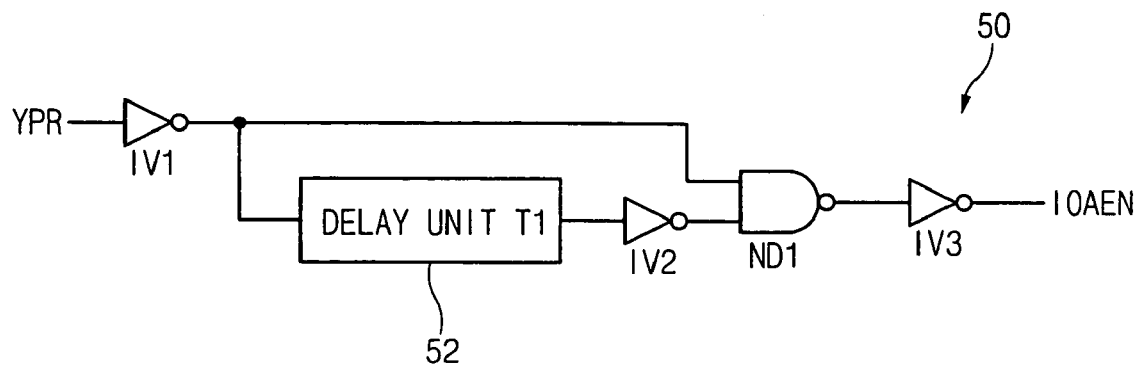
FIG. 2 is a circuit diagram illustrating an input/output amplification control unit of FIG. 1.
Figure 3:
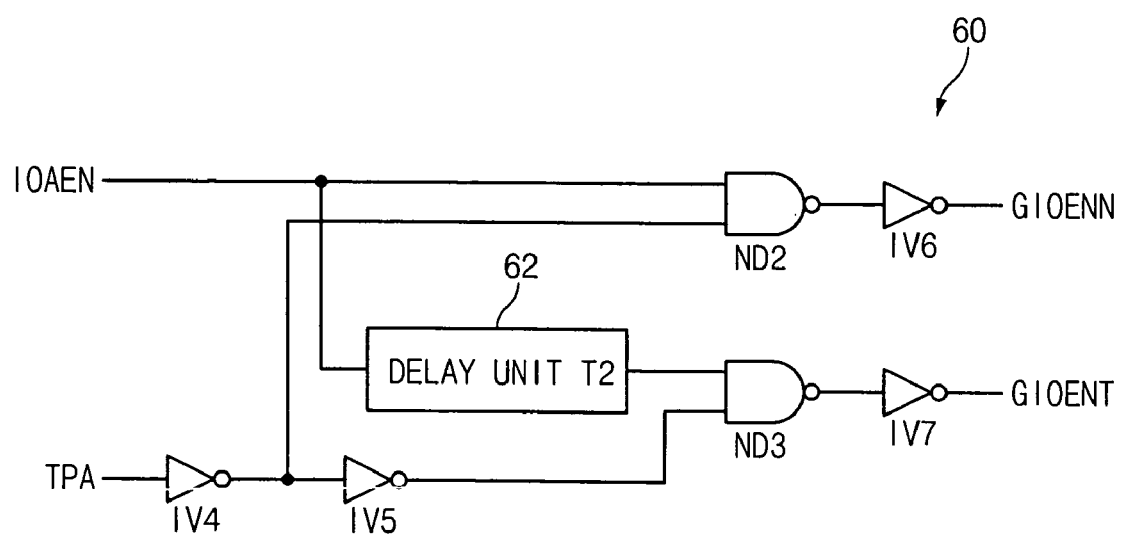
FIG. 3 is a circuit diagram illustrating a global input/output driving control unit of FIG. 1.
Figure 4:
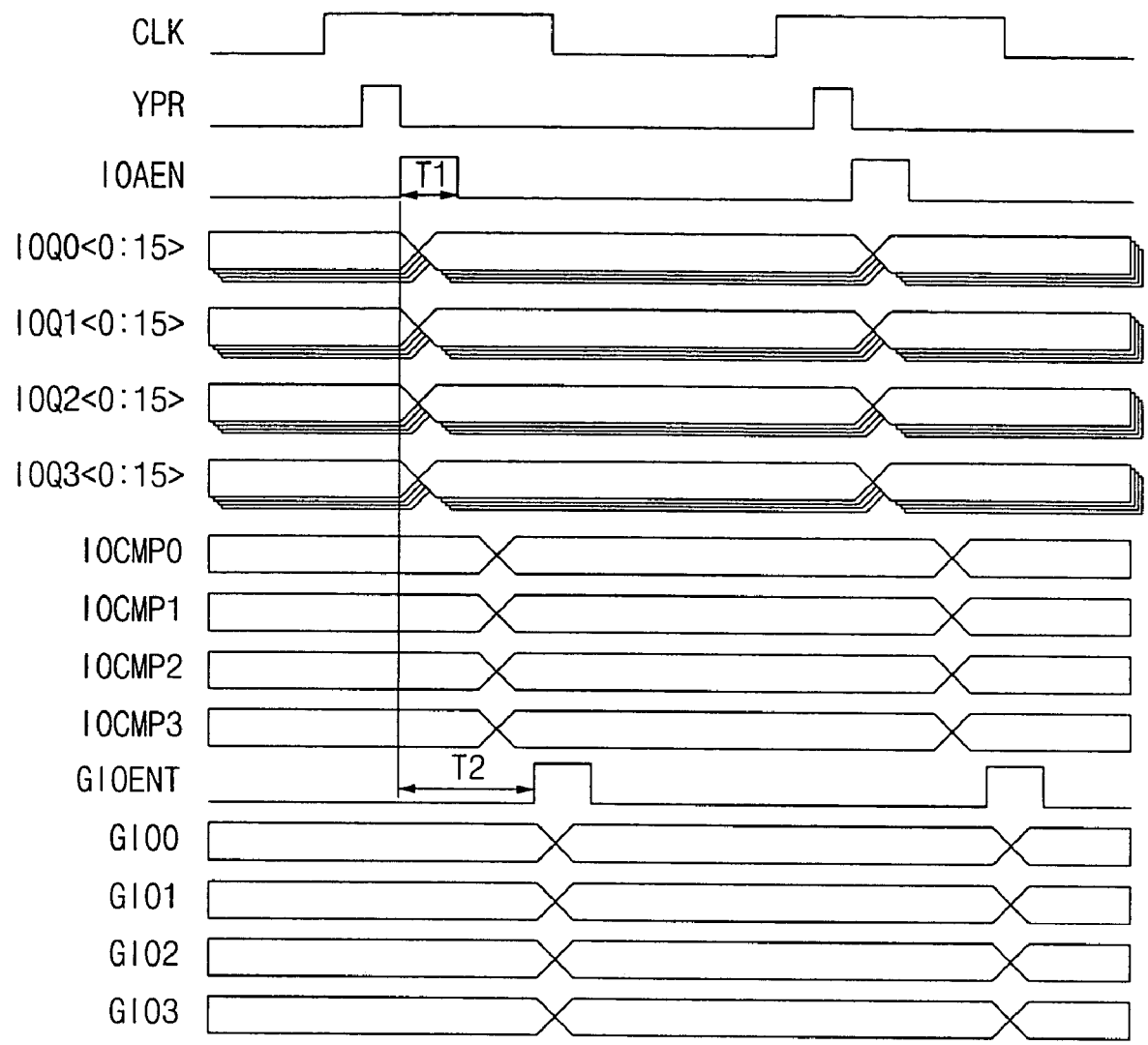
FIG. 4 is a timing diagram illustrating the operation of the parallel compression test circuit of FIG. 1.
Figure 5:
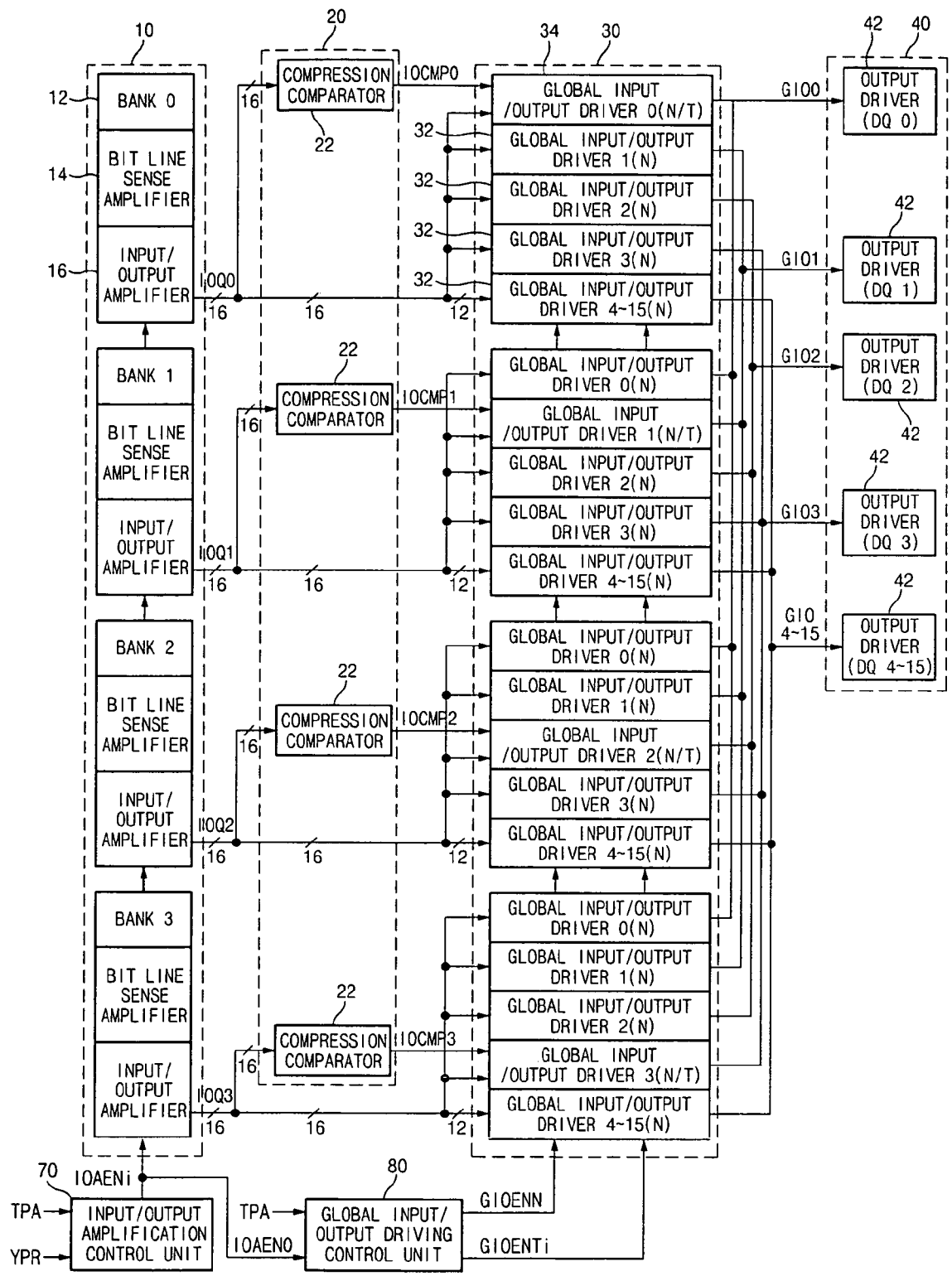
FIG. 5 is a block diagram illustrating a parallel compression test circuit of a memory device according to an embodiment of the present invention.

FIG. 5 is a block diagram illustrating a parallel compression test circuit of a memory device according to an embodiment of the present invention.

In an embodiment, the parallel compression test circuit of FIG. 5 comprises a memory unit 10, a compression comparing unit 20, a global input/output driving unit 30, an output driving unit 40, an input/output amplification control unit 70 and a global input/output driving control unit 80.

The memory unit 10 includes four banks 12, bit line sense amplifiers 14 and input/output sense amplifiers 16. Each of the input/output sense amplifiers 16 is activated with a different time difference by an input/output amplification control signal IOAEN outputted from the input/output amplification control unit 70.

The compression comparing unit 20 compares each data in input/output lines IOQ0~IOQ3 which is outputted from each bank 12 in a compression test. Although the example for compressing and comparing data in 16 input/output lines is described herein, the number of input/output lines for compressing and comparing data can be adjusted if necessary.

The global input/output driving unit 30 includes a plurality of global input/output drivers. The global input/output drivers 34 corresponding to the number of banks drive data in one of the input/output lines IOQ0~IOQ3 in response to a normal input/output driving control signal GIOENN outputted from the global input/output driving control unit 80 in a normal mode, and output the driven data to global input/output lines GIO0~GIO15. In a compression test mode, the global input/output driving units 30 drive signals IOCMP0~IOCMP3 outputted from the compression comparing unit 20 in response to a test global input/output driving control signal GIOENT outputted from the global input/output driving control unit 80, and output the driven data to the global input/output lines GIO0~GIO3. The rest global input/output drivers 32 drive data in one of the input/output lines IOQ0~IOQ3 in response to the normal global input/output driving control signal GIOENN only in the normal mode, and outputs the driven data to the global input/output lines GIO0~GIO15.

The output driving unit 40 drives data in the global input/output lines GIO0~GIO15 to output the driven data externally in the normal mode, and drives data in the global input/output lines GIO0~GIO3 to output the driven data in the compression test mode.

Figure 6:
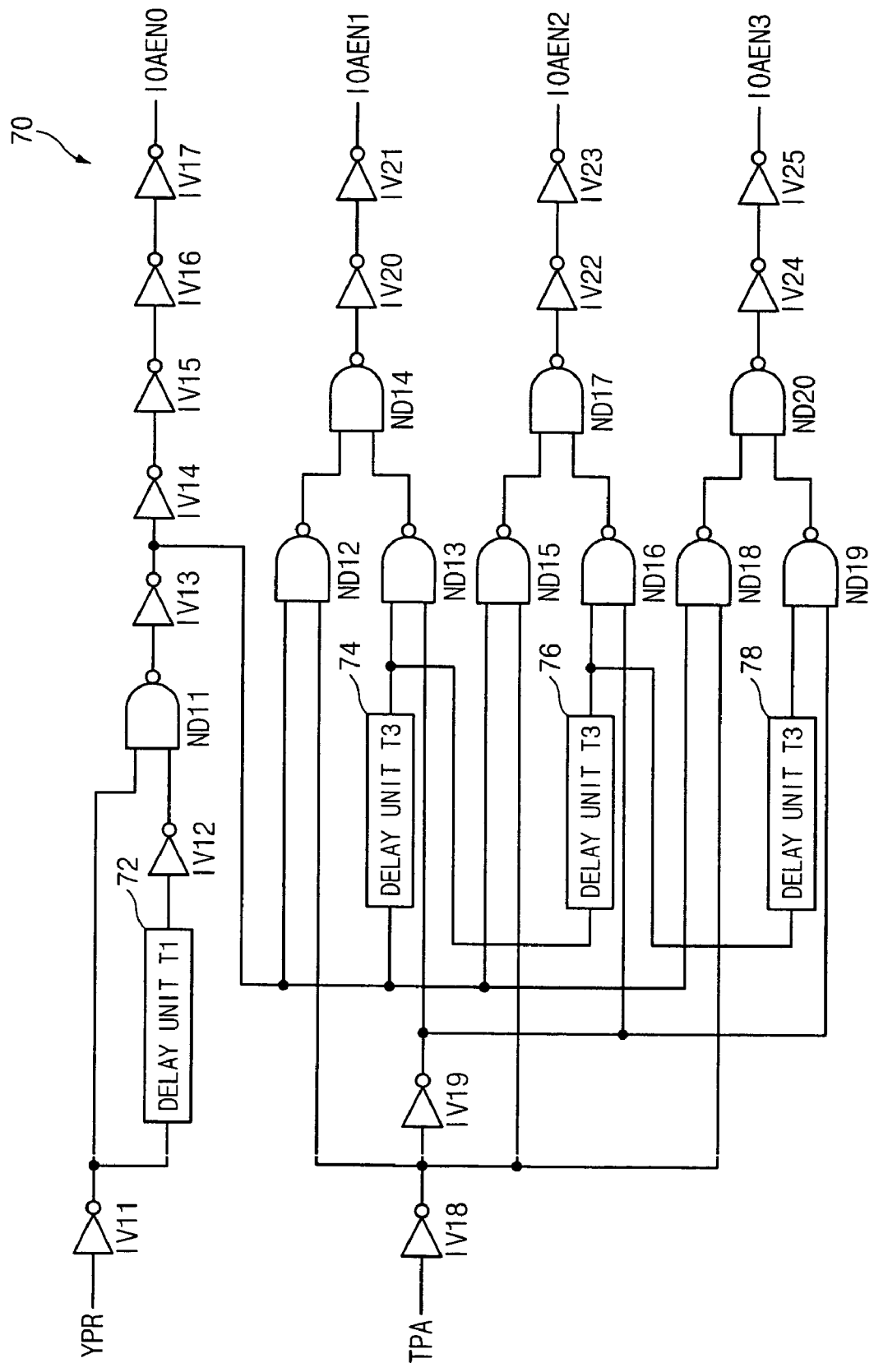
FIG. 6 is a circuit diagram illustrating an input/output amplification control unit of FIG. 5.

FIG. 6 is a circuit diagram illustrating the input/output amplification control unit 70 of FIG. 5.

The input/output sense amplifier control unit 70 comprises delay units 72, 74, 76 and 78, inverters IV11~IV25, and NAND gates ND11~ND20.

The inverter IV11 inverts a signal YPR which represents a read operation period, and the delay unit 72 delays an output signal from the inverter IV11 for a predetermined time T1.

The inverter IV12 inverts an output signal from the delay unit 72, the NAND gate ND11 performs a NAND operation on output signals from the inverters IV11 and IV12, and the inverters IV13~IV17 sequentially invert an output signal from the NAND gate ND11 to output a first input/output amplification control signal IOAEN0.

The inverters IV18 and IV19 sequentially invert a test mode signal TPA.

The NAND gate ND12 performs a NAND operation on output signals from the inverters IV13 and IV18. The delay unit 74 delays the output signal from the inverter IV13 for a predetermined time T3, and the NAND gate ND13 performs a NAND operation on output signals from the delay unit 74 and the inverter IV19. The NAND gate ND14 performs a NAND operation on output signals from the NAND gates ND12 and ND13, and the inverters IV20 and IV21 sequentially invert an output signal from the NAND gate ND14 to output a second input/output amplification control signal IOAEN1.

The NAND gate ND15 performs a NAND operation on the output signals from the inverters IV13 and IV18. The delay unit 76 delays the output signal from the delay unit 74 for the predetermined time T3, and the NAND gate ND16 performs a NAND operation on output signals from the delay unit 76 and the inverter IV19. The NAND gate ND17 performs a NAND operation on output signals from the NAND gates ND15 and ND16, and the inverters IV22 and IV23 sequentially invert an output signal from the NAND gate ND17 to output a third input/output amplification control signal IOAEN2.

The NAND gate ND18 performs a NAND operation on the output signals from the inverters IV13 and IV18. The delay unit 78 delays the output signal from the delay unit 76 for the predetermined time T3, and the NAND gate ND19 performs a NAND operation on output signals from the delay unit 78 and the inverter IV19. The NAND gate ND20 performs a NAND operation on output signals from the NAND gates ND18 and ND19, and the inverters IV24 and IV25 sequentially invert an output signal from the NAND gate ND20 to output a fourth input/output amplification control signal IOAEN3.

Figure 7:
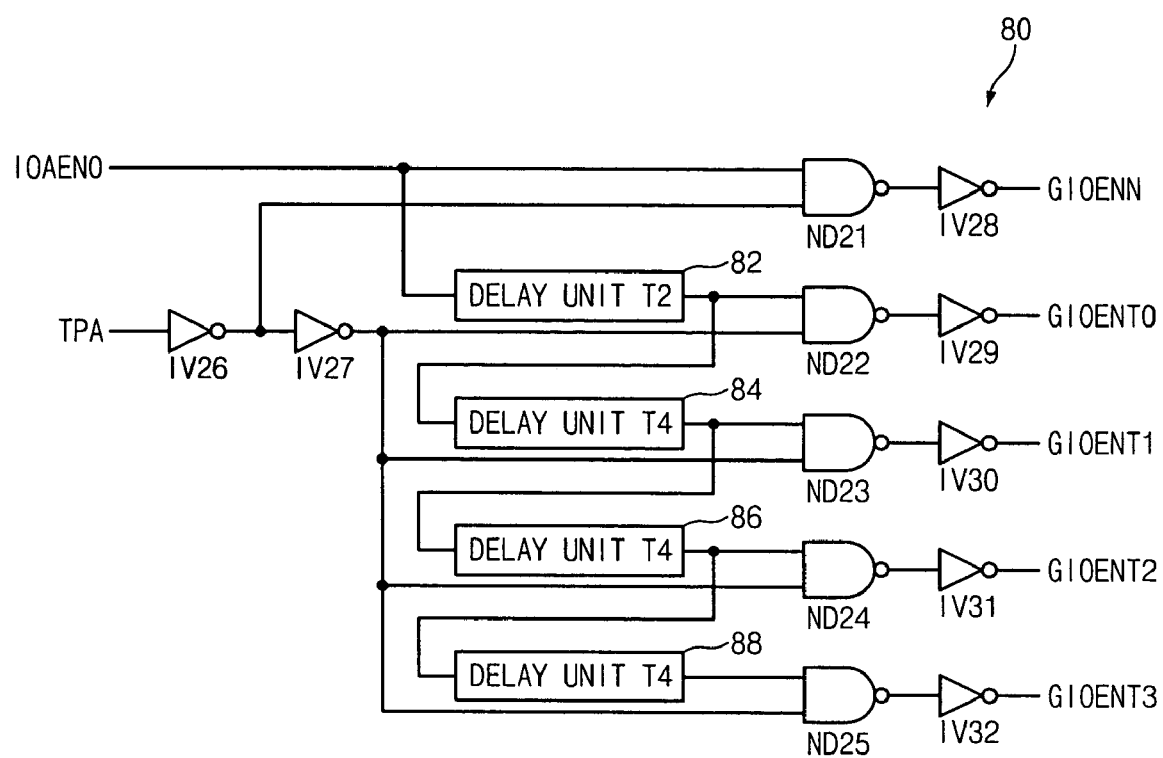
FIG. 7 is a circuit diagram illustrating a global input/output driving control unit of FIG. 5.

FIG. 7 is a circuit diagram illustrating the global input/output driving control unit 80 of FIG. 5.

The input/output driving control unit 80 comprises delay units 82, 84, 86 and 88, inverters IV26~IV32, and NAND gates ND21~ND25.

The inverters IV26 and IV27 sequentially invert the test mode signal TPA, the NAND gate ND21 performs a NAND operation on the first input/output amplification control signal IOAEN0 and an output signal from the inverter IV26, and the inverter IV28 inverts an output signal from the NAND gate ND21 to output the normal global input/output driving control signal GIOENN.

The delay unit 82 delays the first input/output amplification control signal IOAEN0 for a predetermined time T2, the NAND gate ND22 performs a NAND operation on output signals from the delay unit 82 and the inverter IV27, and the inverter IV29 inverts an output signal from the NAND gate ND22 to output a first test global input/output driving control signal GIOENT0.

The delay unit 84 delays an output signal from the delay unit 82 for a predetermined time T4, the NAND gate ND23 performs a NAND operation on output signals from the delay unit 84 and the inverter IV27, and the inverter IV30 inverts an output signal from the NAND gate ND23 to output a second test global input/output driving control signal GIOENT1.

The delay unit 86 delays an output signal from the delay unit 84 for the predetermined time T4, the NAND gate ND24 performs a NAND operation on output signals from the delay unit 86 and the inverter IV27, and the inverter IV31 inverts an output signal from the NAND gate ND24 to output a third test global input/output driving control signal GIOENT2.

The delay unit 88 delays an output signal from the delay unit 86 for the predetermined time T4, the NAND gate ND25 performs a NAND operation on output signals from the delay unit 88 and the inverter IV27, and the inverter IV32 inverts an output signal from the NAND gate ND25 to output a fourth global input/output driving control signal GIOENT3.

Figure 8:
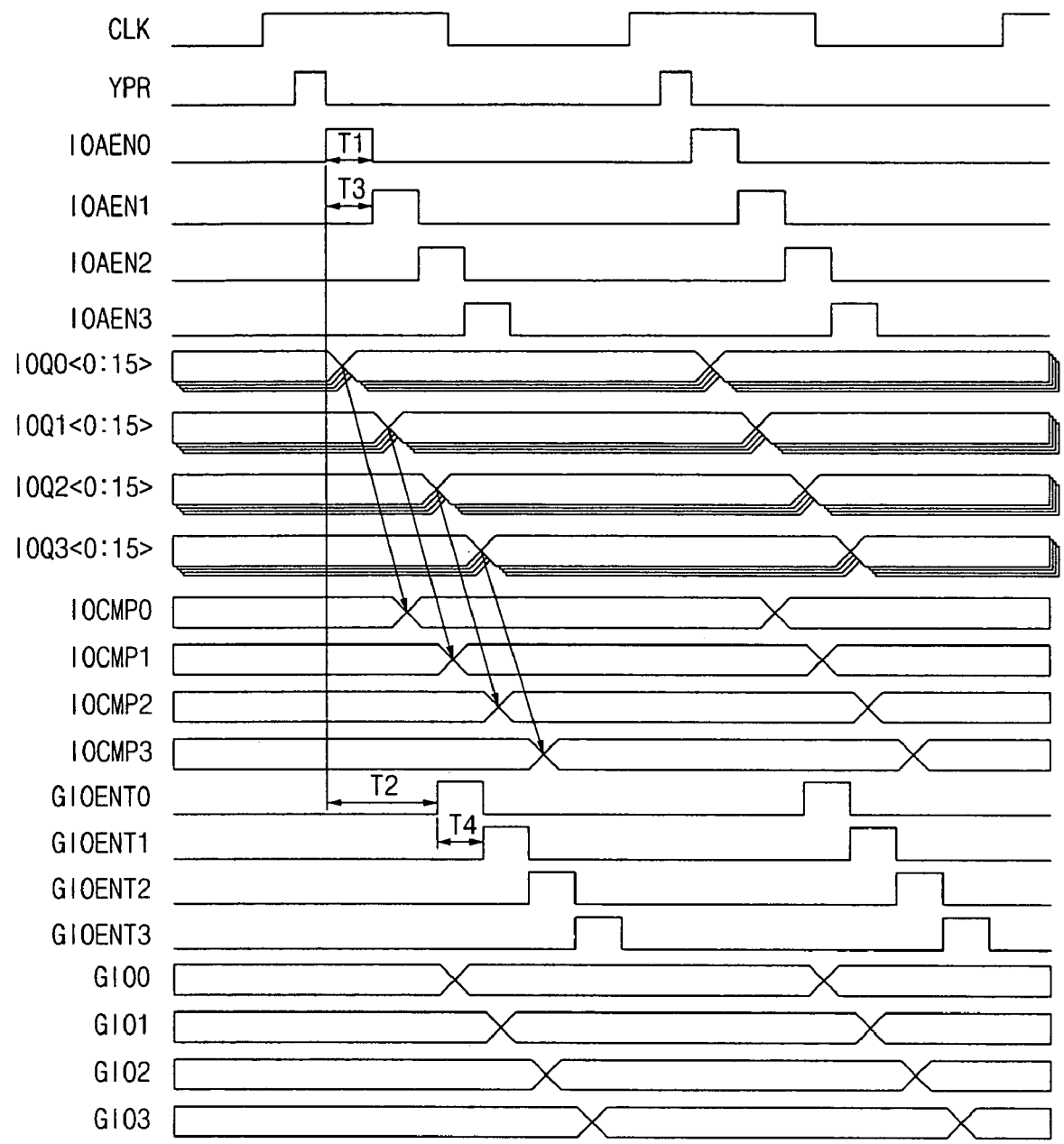
FIG. 8 is a timing diagram illustrating the operation of the parallel compression test circuit of FIG. 5.

FIG. 8 is a timing diagram illustrating the operation of the parallel compression test circuit of FIG. 5.

The input/output amplification control unit 70 outputs the first input/output amplification control signal IOAEN1 having a pulse width corresponding to the delay time T1 of the delay unit 72 in response to the signal YPR which represents the read operation period. Then, when the first input/output amplification control signal IOAEN0 is sequentially delayed to activate the test mode signal TPA, the input/output amplification control unit 70 outputs the second to fourth input/output amplification control signals IOAEN1~IOAEN3. Although the example where the first to fourth input/output amplification control signals IOAEN0~IOAEN3 are sequentially activated is described herein, the signals can be set to have different activation timings, respectively.

In the normal mode, the first to fourth input/output amplification control signals IOAEN0~IOAEN3 are activated at the same time to operate the input/output amplifier 16 of the selected bank 12. However, in the test mode, the first to fourth input/output amplification control signals IOAEN0~IOAEN3 are sequentially activated to sequentially operate the input/output amplifiers 16 of the bank 12. In other words, the input/output amplifier 16 re-amplifies data amplified by the bit line sense amplifier 14 during a high active pulse period of the first to fourth input/output amplification control signals IOAEN0~IOAEN3, and sequentially outputs the output signals IOQ0~IOQ3. Here, the output signals IOQ0~IOQ3 of the input/output amplifier 16 are signals obtained by amplifying data in 16 input/output lines in each bank 12. Although the example where activation timings are differentiated in each bank is described herein, activation timings of the plurality of input/output amplifiers 16 connected to each bank 12 can be set to have a different activation timing, respectively.

The output signals IOQ0~IOQ3 from the input/output amplifier 16 are inputted the compression comparing unit 20 and the global input/output driving unit 40.

Each compression comparator 22 of the compression comparing unit 20 compresses and compares the output signals IOQ0~IOQ3 of the input/output amplifier 16 to output comparison signals IOCMP0~IOCMP3, respectively.

The global input/output driving unit 30 includes global input/output drivers 32 corresponding to the number of input/output lines in each bank 12. Each bank 12 comprises at least one or more of the global input/output drivers 34 for selectively driving results of the normal or test modes.

In the normal mode, when the normal global input/output driving control signal GIOENN outputted from the global input/output driving control unit 60 is activated to a high level, all global input/output drivers 32 and 34 of the global input/output driving unit 30 are activated to drive and output the output signals IOQ0~IOQ3 from the input/output amplifier 16 to the global input/output lines GIO0~GIO15. All output drivers 42 of the output driving unit 40 drive and output data in the global input/output lines GIO0~GIO15.

In the compression test mode, when the test global input/output driving control signals GIOENT0~GIOENT3 outputted from the global input/output driving control unit 60 are activated to a high level, the global input/output drivers 34 of the global input/output driving unit 30 are sequentially activated to drive the comparison signals IOCMP0~IOCMP3 outputted from the compression comparator 22 and output the driven signals to the global input/output lines GIO0~GIO3. The output drivers 42 in the output driving unit 40 drive and output data in the global input/output lines GIO0~GIO3. Although the example where the global input/output drivers 34 are sequentially activated herein, the drivers can be set to have different activation timings, respectively.

As discussed earlier, a parallel compression test circuit according to an embodiment of the present invention disperses peak current and reduces noise by operating input/output amplifiers at different timings in each bank.

Also, the parallel compression test circuit according to an embodiment of the present invention improves reliability of a parallel test mode by reducing difference in test results of a normal mode and a parallel test mode.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A compression test circuit of a memory device, comprising:
   a plurality of banks each comprising a plurality of bit line sense amplifiers for sensing and amplifying data in bit lines;
   a plurality of input/output amplifiers to amplify data which is amplified by the bit line sense amplifier and is loaded in input/output lines;
   a plurality of compression comparators for compressing and comparing data amplified by the plurality of input/output amplifiers in each bank;
   a plurality of global input/output drivers for driving each data amplified by the plurality of input/output amplifiers or for driving each of a plurality of comparison signals outputted from the plurality of compression comparators;
   a plurality of output drivers for driving data driven by the global input/output driving unit to an external pin; and
   an input/output amplification control unit for generating a plurality of first control signals to activate the plurality of input/output amplifiers in each bank at different timings in a test mode.

2. The compression test circuit according to claim 1, wherein the input/output amplification control unit comprises:
   a reference signal generating unit for generating a reference signal in response to a read mode signal; and
   a control signal generating unit for generating the plurality of first control signals in response to a plurality of delay signals each obtained by delaying the reference signal for a different delay time in the test mode.

3. The compression test circuit according to claim 2, wherein the reference signal generating unit includes a pulse generator.

4. The compression test circuit according to claim 2, wherein the control signal generating unit comprises:
   a normal operation control unit for controlling the plurality of first control signals to have the same logic state as that of the reference signal in response to the reference signal and the test mode signal in a normal operation; and
   a test operation control unit for controlling the plurality of first control signals each to have a different activation point in response to the delay signal and the test mode signal in the test mode.

5. The compression test circuit according to claim 4, wherein the test operation control unit includes a plurality of delay units each for delaying the reference signal for a different delay time to generate a plurality of delay signals.

6. The compression test circuit according to claim 1, wherein one or more in each bank of the plurality of global input/output drivers drive data amplified by the plurality of input/output amplifiers or drive a plurality of comparison signals outputted from the plurality of compression comparators.

7. The compression test circuit according to claim 6, further comprising a global input/output driving control unit for activating the predetermined number of global input/output drivers at a different activation point in the test mode.

8. The compression test circuit according to claim 7, wherein the global input/output driving control unit comprises:
   a normal driving signal generating unit for generating a normal driving signal to activate the plurality of global input/output drivers connected the selected bank in response to the first control signal and the test mode signal in a normal mode; and
   a test driving signal generating unit for generating a plurality of test driving signals to activate the predetermined number of global input/output drivers at a different activation point in response to the first control signal and the test mode signal in the test mode.

9. The compression test circuit according to claim 8, wherein the test driving signal generating unit includes a plurality of delay units each obtained by delaying the first control signal for a different delay time to generate a plurality of delay signals.

10. A compression test circuit of a memory device, comprising:
- a plurality of banks each comprising a plurality of bit line sense amplifiers for sensing and amplifying data in bit lines;
- a plurality of input/output amplifiers to amplify data which is amplified by the bit line sense amplifier and is loaded in input/output lines;
- a plurality of compression comparators for compressing and comparing data amplified by the plurality of input/output amplifiers in each bank;
- a plurality of global input/output drivers for driving each data amplified by the plurality of input/output amplifiers or driving each of a plurality of comparison signals outputted from the plurality of compression comparators;
- a plurality of output drivers for driving data driven by the global input/output driving unit to an external pin; and
- an input/output amplification control unit for generating a plurality of first control signals to activate the plurality of input/output amplifiers connected to each bank in a test mode by a plurality of groups at different timings.

11. The compression test circuit according to claim 10, wherein the input/output amplification control unit comprises:
- a reference signal generating unit for generating a reference signal in response to a read mode signal; and
- a control signal generating unit for generating the plurality of first control signals in response to a plurality of delay signals each for delaying the reference signal for a different delay time in the test mode.

12. The compression test circuit according to claim 11, wherein the reference signal generating unit includes a pulse generator.

13. The compression test circuit according to claim 11, wherein the control signal generating unit comprises:
- a normal operation control unit for controlling the plurality of first control signals to have the same logic state as that of the reference signal in response to the reference signal and the test mode signal in a normal operation; and
- a test operation control unit for controlling the plurality of first control signals to have different activation points in response to the delay signal and the test mode signal in the test mode.

14. The compression test circuit according to claim 13, wherein the test operation control unit includes a plurality of delay units each for delaying the reference signal for a different delay time to generate the plurality of delay signals.

15. The compression test circuit according to claim 10, wherein one or more in each bank of the plurality of global input/output drivers drive data amplified by the plurality of input/output amplifiers or drive a plurality of comparison signals outputted from the plurality of compression comparators.

16. The compression test circuit according to claim 15, further comprising a global input/output driving control unit for activating the predetermined number of global input/output drivers at a different activation point in the test mode.

17. The compression test circuit according to claim 16, wherein the global input/output driving control unit comprises:
- a normal driving signal generating unit for generating a normal driving signal to activate the plurality of global input/output drivers connected to the selected bank in response to the first control signal and the test mode signal in a normal mode; and
- a test driving signal generating unit for generating a plurality of test driving signals to activate the predetermined number of global input/output drivers at a different activation point in response to the first control signal and the test mode signal in the test mode.

18. The compression test circuit according to claim 17, wherein the test driving signal generating unit includes a plurality of delay units each for delaying the first control signal for a different delay time to generate a plurality of delay signals.

* * * * *